US012770566B2

(12) United States Patent
Lee

(10) Patent No.: US 12,770,566 B2
(45) Date of Patent: Oct. 20, 2026

(54) DISPLAY APPARATUS

(71) Applicant: LG Display Co., Ltd., Seoul (KR)

(72) Inventor: Jisoo Lee, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/195,408

(22) Filed: Apr. 30, 2025

(65) Prior Publication Data

US 2026/0171017 A1 Jun. 18, 2026

(30) Foreign Application Priority Data

Dec. 18, 2024 (KR) ........................ 10-2024-0189770

(51) Int. Cl.
*G09G 3/3233* (2016.01)
*H10K 59/131* (2023.01)
*H10K 59/88* (2023.01)

(52) U.S. Cl.
CPC ......... *G09G 3/3233* (2013.01); *H10K 59/131* (2023.02); *H10K 59/88* (2023.02); *G09G 2300/0413* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01); *G09G 2330/08* (2013.01); *G09G 2330/10* (2013.01)

(58) Field of Classification Search
CPC ......... G09G 3/3233; G09G 2300/0819; G09G 2300/0842; G09G 2330/08; G09G 2320/0233; G09G 2310/08; G09G 2300/0861; G09G 2330/10; G09G 2300/0413; H10K 59/131; H10K 59/88
See application file for complete search history.

(56) References Cited

U.S. PATENT DOCUMENTS

| | | | | |
|---|---|---|---|---|
| 2015/0170562 A1* | 6/2015 | In | G09G 3/2029 | 345/80 |
| 2015/0294618 A1* | 10/2015 | Park | G09G 3/3291 | 345/78 |
| 2016/0163243 A1* | 6/2016 | Park | G09G 3/3258 | 345/87 |
| 2026/0040808 A1* | 2/2026 | Jang | H10K 71/861 | |

FOREIGN PATENT DOCUMENTS

KR 102313063 B1 10/2021

* cited by examiner

*Primary Examiner* — Muhammad N Edun
(74) *Attorney, Agent, or Firm* — Fish & Richardson P.C.

(57) ABSTRACT

A display apparatus includes a dummy pixel for repairing a defective pixel, the dummy pixel including a dummy transistor for controlling the reset of the repair wiring and a reset capacitor having a capacitance value equal to or greater than a reference value relative to the capacitance of the repair wiring, thereby enabling the repair wiring to be reset by an appropriate capacitance.

18 Claims, 14 Drawing Sheets

DISPLAY APPARATUS

CROSS REFERENCE TO RELATED APPLICATIONS

Pursuant to 35 U.S.C. § 119(a), this application claims the benefit of an earlier filing date and right of priority to Korean Patent Application No. 10-2024-0189770, filed Dec. 18, 2024, the entire contents of which are incorporated by reference herein.

TECHNICAL FIELD

This disclosure relates to a display apparatus, and more particularly, to a repairable display apparatus.

BACKGROUND

An organic light-emitting display apparatus is a self-emissive display device that, unlike a liquid crystal display, requires no separate light source, enabling lightweight and thin manufacturing. Additionally, an organic light-emitting display apparatus offers advantages in power consumption due to low-voltage driving and excels in color reproduction, response speed, viewing angle, and contrast ratio, positioning it as a next-generation display under research.

Display apparatuses are continuously improved to enhance screen resolution and luminance, delivering clearer images to users.

SUMMARY

A display apparatus according to an implementation of this disclosure includes a dummy pixel for repairing a defective pixel, the dummy pixel including a dummy transistor for controlling the reset of a repair wiring and a reset capacitor having a capacitance value equal to or greater than a reference value relative to the capacitance of the repair wiring.

A display apparatus according to another implementation of this disclosure includes a dummy pixel for repairing a defective pixel, the dummy pixel including a dummy transistor having a controlled activation time for resetting a repair wiring.

DETAILED DESCRIPTION

Figure 1:
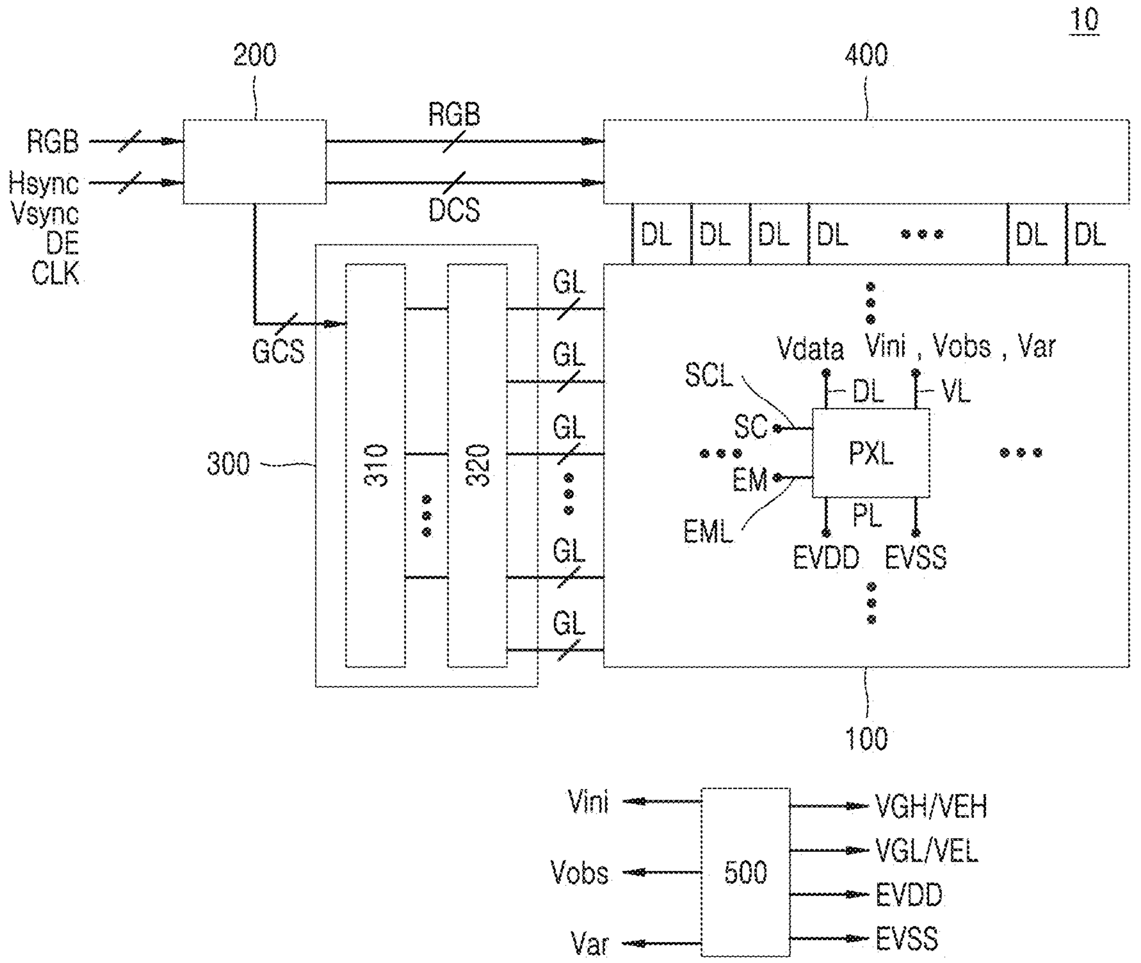
FIG. 1 is a block diagram schematically illustrating an organic light-emitting display apparatus according to an implementation of this disclosure.

A display apparatus includes a light-emitting element and a pixel driving circuit that drives the light-emitting element. The pixel driving circuit includes a thin-film transistor and a capacitor. In some scenarios, defects may occur in the pixel driving circuit, such as in the thin-film transistor or capacitor. In such scenarios, a light-emitting element connected to a defective pixel driving circuit may cause dark spot or bright spot defects.

Pixel defects due to a defective pixel driving circuit are difficult to trace to their exact origin. Thus, repairing pixel defects caused by defects in the pixel driving circuit is challenging. To address this, implementations of the present disclosure provide a display apparatus capable of repairing such defects when a pixel defect occurs due to a defect in the pixel driving circuit.

An objective of an implementation of this disclosure is to provide a display apparatus capable of repairing defective pixels caused by defects in the pixel driving circuit.

The objectives of an implementation of this disclosure are not limited to those mentioned above, and other objectives not mentioned will be clearly understood by those skilled in the art from the detailed description.

Advantages and features disclosed in this disclosure and methods of accomplishing the same may be understood more readily by reference to the detailed description of implementations that will be made hereinafter with reference to the accompanying drawings. However, this disclosure is not limited to the implementations disclosed below and may be implemented in various different forms; these implementations are provided merely to ensure that the disclosure of this disclosure is complete and to fully inform those of ordinary skill in the art of the scope of the disclosure, with this disclosure being defined solely by the scope of the claims.

The shapes, sizes, ratios, angles, numbers and the like illustrated in the drawings to describe implementations of the disclosure are merely examples, and thus, the disclosure is not limited thereto. Throughout the disclosure, the same reference numerals refer to the same components. In addition, detailed descriptions of well-known technologies may be omitted in the disclosure to avoid obscuring the subject matter of the disclosure. When terms such as "comprises," "has," "includes," or "is made up of" are used in this disclosure, it should be understood that unless "only" is specifically used, additional elements or steps can be included. Unless otherwise explicitly stated, when a component is expressed in the singular form, it is intended to encompass the plural form as well.

In interpreting the components, it is construed to include a margin of error even in the absence of explicit description.

In the case of describing positional relationships, for example, when the positional relationship between two components is described using terms such as "on,' "on top of," "below," or "beside," one or more other components may be positioned between the two components unless "directly" or "immediately" is specified.

When describing temporal relationships, expressions such as "after," "following," "next," or "before" may indicate a sequence of events, and unless "immediately" or "directly" is used, non-continuous cases may also be included.

When describing a signal flow relationship, for example, in the case of "a signal is transmitted from node A to node B," instances where the signal is transmitted from node A to node B via another node may also be included unless "immediately" or "directly" is specified.

Terms like "first," "second," etc., are used to describe various components, but these components are not limited by these terms. These terms are merely used for distinguishing one component from the other components. Therefore, the first component mentioned hereinafter may be the second component in the technical sense of this disclosure.

The various features of the implementations of the disclosure can combined or assembled together, either partially or entirely, in a technically diverse manner, and each implementation can be independently implemented or in conjunction with related implementations.

In describing the implementations, descriptions of components identical or corresponding to those in the previous implementation will be omitted. Hereinafter, a display apparatus capable of repairing defective pixels caused by defects in the pixel driving circuit according to an implementation of this disclosure will be described.

Various implementations of this disclosure will now be described in detail with reference to the accompanying drawings.

FIG. 1 is a block diagram schematically illustrating an organic light-emitting display apparatus according to an implementation of this disclosure.

Referring to FIG. 1, a display apparatus 10 includes a display panel 100 including a plurality of pixels PXL, a controller 200, a gate driver 300 supplying scan signals SC to the plurality of pixels PXL, a data driver 400 supplying data voltages Vdata to the plurality of pixels PXL, and a power supply 500 providing voltages required for driving the plurality of pixels PXL.

In the display panel 100, a plurality of gate lines GL and a plurality of data lines DL intersect each other, and each of the plurality of pixels PXL is connected to a gate line GL and a data line DL. Specifically, one pixel PXL receives a gate signal from the gate driver 300 via a gate line GL, a data signal from the data driver 400 via a data line DL, and a high-potential driving voltage EVDD and a low-potential driving voltage EVSS from the power supply 500.

The gate line GL supplies a scan signal SC and an emission control signal EM, and the data line DL supplies a data voltage Vdata. Additionally, depending on various implementations, the gate line GL may include a plurality of scan lines SCL supplying scan signals SC and an emission control signal line EML supplying emission control signals EM. Additionally, the plurality of pixels PXL may further include a power line VL to receive a bias voltage Vobs, an initialization voltage Vini, and an anode reset voltage Var.

Moreover, each pixel PXL includes a light-emitting element and a pixel driving circuit. The pixel driving circuit includes a plurality of switching elements, a driving element, and a capacitor. Here, the switching elements and driving element may be composed of thin-film transistors. In the pixel driving circuit, the driving element controls the current supplied to the light-emitting element based on the data voltage, thereby adjusting the light emission amount of the light-emitting element. Additionally, the plurality of switching elements receive a scan signal SC supplied via the plurality of scan lines SCL and an emission control signal EM supplied via the emission control line EML to operate the pixel driving circuit.

The display panel 100 may be implemented as a non-transmissive display panel or a transmissive display panel. A transmissive display panel may be applied to a transparent display device where an image is displayed on the screen and real objects in the background are visible. The display panel 100 may be fabricated as a flexible display panel. A flexible display panel may be implemented as an OLED panel using a plastic substrate.

Touch sensors may be disposed on the display panel 100. Touch input may be sensed using separate touch sensors or through the pixels PXL. The touch sensors may be implemented as on-cell type or add-on type touch sensors disposed on the screen of the display panel, or as in-cell type touch sensors embedded in the display panel 100.

The controller 200 processes image data RGB input from an external source to match the size and resolution of the display panel 100 and supplies it to the data driver 400. The controller 200 generates a gate control signal GCS and a data control signal DCS using synchronization signals input from an external source, such as a clock signal CLK, a data enable signal DE, a horizontal synchronization signal Hsync, and a vertical synchronization signal Vsync. The controller 200 supplies the gate control signal GCS and the data control signal DCS to the gate driver 300 and the data driver 400, respectively, thereby controlling the gate driver 300 and the data driver 400.

The controller 200 may be combined with various processors, such as a microprocessor, a mobile processor, or an application processor, depending on the device in which it is implemented.

The host system may be any one of a TV system, a set-top box, a navigation system, a personal computer PC, a home theater system, a mobile device, a wearable device, or a vehicle system.

The controller 200 may control the operation timing of the gate driver 300 and the data driver 400 at a frame frequency of input frame frequency×i (where i is a positive integer greater than 0) Hz by multiplying the input frame frequency by i. The input frame frequency is 60 Hz in the NTSC (National Television Standards Committee) system and 50 Hz in the PAL (Phase-Alternating Line) system.

The controller 200 generates signals to enable the pixel PXL to be driven at various refresh rates. The refresh rate may be defined as the number of frames transmitted per second. That is, the controller 200 generates signals related to driving such that the pixel PXL can be driven at a variable refresh rate when operating in a Variable Refresh Rate VRR mode, allowing switching to different refresh rates. For example, the controller 200 may simply change the speed of the clock signal or generate a synchronization signal to include a horizontal blank or vertical blank.

Based on timing signals Vsync, Hsync, and DE received from the host system, the controller 200 generates a gate control signal GCS to control the operation timing of the gate driver 300 and a data control signal DCS to control the operation timing of the data driver 400. The controller 200 synchronizes the gate driver 300 and the data driver 400 by controlling their operation timing.

The voltage level of the gate control signal GCS output from the controller 200 may be converted into a gate-on voltage VGL, VEL and a gate-off voltage VGH, VEH through a level shifter and supplied to the gate driver 300. The level shifter converts a low-level voltage of the gate control signal GCS into a gate low voltage VGL and a high-level voltage of the gate control signal GCS into a gate high voltage VGH. The gate control signal GCS includes a start pulse and a shift clock.

The gate driver 300 supplies scan signals SC to the gate line GL in response to the gate control signal GCS supplied from the controller 200. The gate driver 300 may be disposed on one side or both sides of the display panel 100 using a Gate In Panel GIP configuration.

The gate driver 300 sequentially outputs gate signals to the plurality of gate lines GL under the control of the controller 200. The gate driver 300 may sequentially supply the gate signals to the gate lines GL by shifting the gate signals using a shift register.

The gate signal may include a scan signal SC and an emission control signal EM in an organic light-emitting display apparatus. The scan signal SC includes a scan pulse that swings between a gate-on voltage VGL and a gate-off voltage VGH. The emission control signal EM may include an emission control signal pulse that swings between a gate-on voltage VEL and a gate-off voltage VEH. The scan pulse, synchronized with the data voltage Vdata, is used to select the pixels PXL of the line where data is to be written. The emission control signal pulse defines the emission time of the pixels PXL.

The gate driver 300 includes an emission control signal driver 310 and at least one scan driver 320. The emission control signal driver 310 outputs an emission control signal pulse in response to a start pulse and a shift clock from the controller 200 and sequentially shifts the emission control signal pulse according to the shift clock. The scan driver 320 outputs a scan pulse in response to a start pulse and a shift clock from the controller 200 and shifts the scan pulse in accordance with the shift clock timing.

The data driver 400 converts image data RGB into a data voltage Vdata in response to the data control signal DCS supplied from the controller 200 and supplies the converted data voltage Vdata to the pixels PXL through the data line DL.

In FIG. 1, the data driver 400 is illustrated as being disposed on one side of the display panel 100 in a single form, but the number and arrangement position of the data driver 400 are not limited thereto. The data driver 400 may be composed of a plurality of integrated circuits IC arranged separately on one side of the display panel 100.

The power supply 500 uses a DC-DC converter to generate the DC power required for driving the pixel array of the display panel 100, the gate driver 300, and the data driver 400. The DC-DC converter may include a charge pump, a regulator, a buck converter, a boost converter, and the like. The power supply 500 may receive a direct current input voltage from a host system and generate direct current voltages such as a gate-on voltage VGL and VEL, a gate-off voltage VGH/VEH, a high-potential driving voltage EVDD, and a low-potential driving voltage EVSS. The gate-on voltage VGL and VEL and gate-off voltage VGH and VEH are supplied to the level shifter and gate driver 300. The high-potential driving voltage EVDD and the low-potential driving voltage EVSS are supplied to the pixels PXL.

Additionally, the power supply unit 500 may generate direct current voltages such as the initialization voltage Vini, bias voltage Vobs, and anode reset voltage Var. The initialization voltage Vini, bias voltage Vobs, and anode reset voltage Var are supplied to the pixel PXL through the power line VL. Here, the power line VL may include a bias voltage bus line VobsL, an anode reset voltage bus line VarL, and an initialization voltage bus line ViniL.

Figure 2:
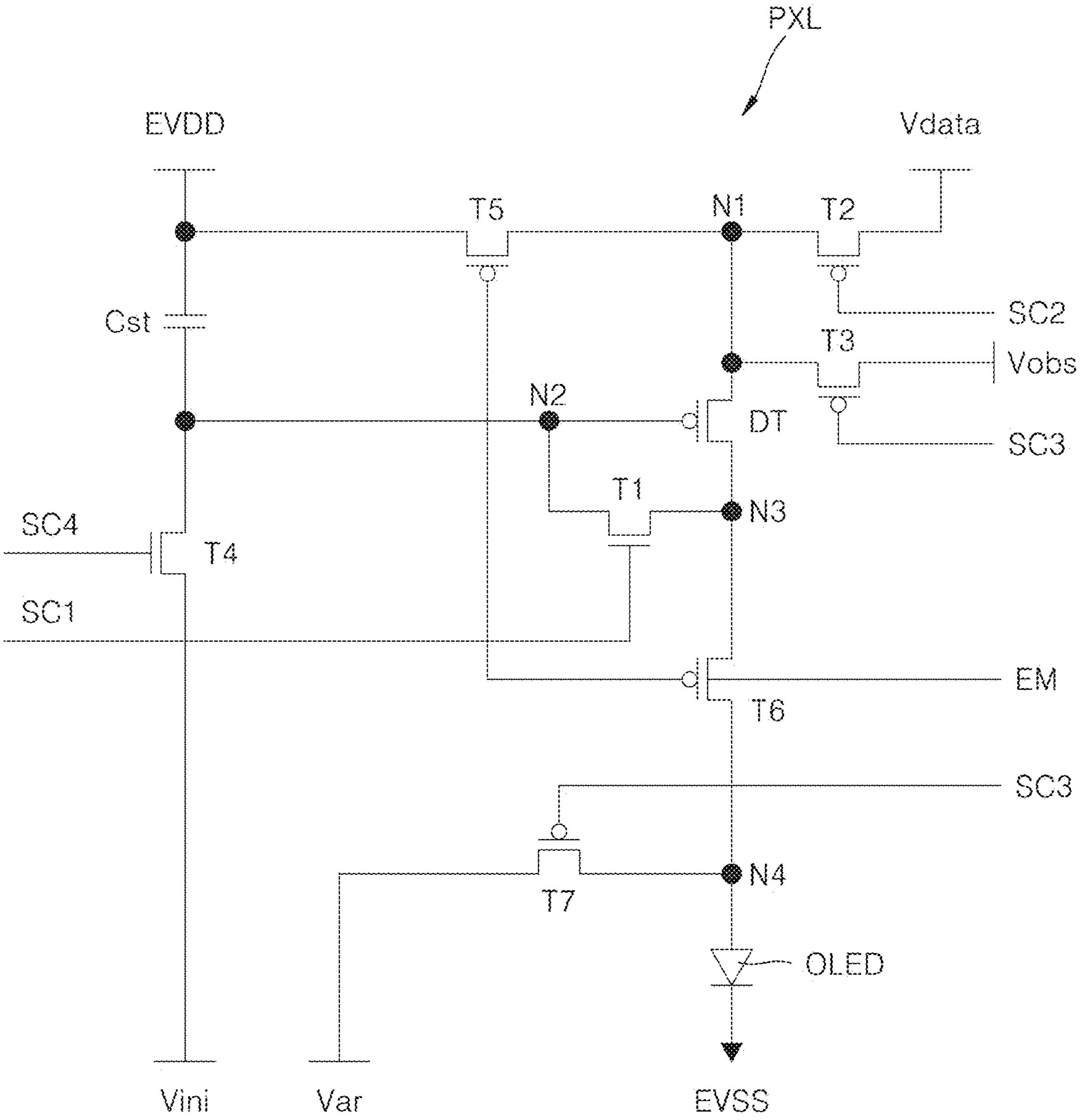
FIG. 2 is a circuit diagram of a pixel in an organic light-emitting display apparatus according to an implementation of this disclosure.

FIG. 2 is a circuit diagram of a pixel in an organic light-emitting display apparatus according to an implementation of this disclosure;

Referring to FIG. 2, each of the plurality of pixels PXL includes a light-emitting element OLED and a pixel driving circuit that drives the light-emitting element OLED. The pixel driving circuit includes a driving transistor DT, first to seventh transistors T1 to T7, and a storage capacitor Cst. Each of the driving transistor DT and the first to sixth transistors T1 to T6 may include a first electrode, a second electrode, and a gate electrode. One of the first and second electrodes may be a source electrode, and the other may be a drain electrode.

Each of the driving transistor DT and the first to sixth transistors T1 to T7 may be a P-type thin-film transistor or an N-type thin-film transistor. For example, the driving transistor DT, second, third, fifth, sixth, and seventh transistors T2, T3, T5, T6, and T7 may be P-type thin-film transistors, and the first and fourth transistors T1 T4 may be N-type thin-film transistors.

According to an example, the first transistor T1 may function as a transistor that compensates for characteristics of the driving transistor DT, such as threshold voltage and mobility, the second transistor T2 as a transistor that supplies the data voltage Vdata, the third transistor T3 as a transistor that supplies the bias voltage Vobs, the fourth transistor T4 as a transistor that initializes the storage capacitor Cst and the gate electrode of the driving transistor DT, the fifth and sixth transistors T5 T6 as transistors that control the emission time of the light-emitting element OLED, and the seventh transistor T7 as a transistor that resets the anode electrode of the light-emitting element OLED.

The light-emitting element OLED includes an anode electrode, an emission layer, and a cathode electrode. For example, the light-emitting layer may be an organic or inorganic light-emitting layer. The anode electrode of the light-emitting element OLED is connected to the fourth node N4, and the cathode electrode is connected to the low-potential driving voltage EVSS.

The driving transistor DT may include a first electrode connected to the first node N1, a gate electrode connected to the second node N2, and a second electrode connected to the third node N3. The driving transistor DT controls the driving current Ids to cause the light-emitting element OLED to emit light based on the voltage at the second node N2, which is the data voltage Vdata sampled by the storage capacitor Cst.

The first transistor T1 includes a first electrode connected to the gate electrode of the driving transistor DT, a second electrode connected to the second electrode of the driving transistor DT, and a gate electrode receiving the first scan signal SC1. The first transistor T1 turns on in response to the first scan signal SC1 and samples the threshold voltage of the driving transistor DT to the storage capacitor Cst by connecting the driving transistor DT.

The storage capacitor Cst may be connected between a terminal to which the high-potential driving voltage EVDD is applied and the second node N2 corresponding to the gate electrode of the driving transistor DT. The storage capacitor Cst may sample the threshold voltage of the driving transistor DT or the data voltage Vdata depending on the operation of the pixel driving circuit.

The second transistor T2 may include a first electrode connected to the data line DL supplying the data voltage Vdata, a second electrode connected to the first node N1 corresponding to the first electrode of the driving transistor DT, and a gate electrode receiving the second scan signal SC2. The second transistor T2 turns on in response to the second scan signal SC2 and transfers the data voltage Vdata to the second node N2.

The third transistor T3 may include a first electrode receiving the bias voltage Vobs, a second electrode connected to the first node N1 corresponding to the first electrode of the driving transistor DT, and a gate electrode receiving the third scan signal SC3. The third transistor T3 may supply the bias voltage Vobs to the first electrode of the driving transistor DT in response to the third scan signal SC3.

The fourth transistor T4 may include a first electrode receiving the initialization voltage Vini, a second electrode connected to the second node N2 corresponding to the gate electrode of the driving transistor DT, and a gate electrode receiving the fourth scan signal SC4. The fourth transistor T4 may initialize the gate electrode of the driving transistor DT and the storage capacitor Cst by supplying the initialization voltage Vini to the gate electrode of the driving transistor DT and the storage capacitor Cst in response to the fourth scan signal SC4.

The fifth transistor T5 may include a first electrode receiving the high-potential driving voltage EVDD, a second electrode connected to the first node N1 corresponding to the first electrode of the driving transistor DT, and a gate electrode receiving the emission control signal EM.

The sixth transistor T6 may include a first electrode connected to the third node N3 corresponding to the second electrode of the driving transistor DT, a second electrode connected to the fourth node N4 corresponding to the anode electrode of the light-emitting element OLED, and a gate electrode receiving the emission control signal EM.

The fifth and sixth transistors T5 and T6 turn on in response to the emission control signal EM and form a current path for the driving current controlled by the driving transistor DT between the high-potential driving voltage EVDD and the low-potential driving voltage EVSS. The fifth and sixth transistors T5 and T6 may control the emission time of the light-emitting element OLED with their turn-on time.

The seventh transistor T7 may include a first electrode receiving the anode reset voltage Var, a second electrode connected to the fourth node N4 corresponding to the anode electrode of the light-emitting element OLED, and a gate electrode receiving the third scan signal SC3.

The seventh transistor T7 turns on in response to the third scan signal SC3 and resets the anode electrode of the light-emitting element OLED by supplying the anode reset voltage Var to the anode electrode of the light-emitting element OLED. The seventh transistor T7 may supply the anode reset voltage Var to the anode electrode of the light-emitting element OLED before or after the light-emitting element OLED emits light.

The display apparatus may operate as a VRR mode display apparatus. The VRR mode may operate pixels by driving at a constant frequency and increasing the refresh rate at which the data voltage Vdata is updated when high-speed driving is required, or lowering the refresh rate to reduce power consumption or when low-speed driving is needed.

The pixel driving circuit may be driven through a combination of a refresh frame and an anode reset frame. In this disclosure, the refresh frame may be defined as a period during which the data voltage Vdata is updated, and the anode reset frame may be defined as a period during which the data voltage Vdata is not updated. One frame may be driven solely by a refresh frame according to the refresh rate or by alternating refresh frames and anode reset frames.

For example, driving at a refresh rate of 120 Hz may involve only refresh frames. Driving at a refresh rate of 60 Hz may involve alternating refresh frames and anode reset frames. Driving at a refresh rate of 1 Hz may involve one frame consisting of one refresh frame followed by 119 anode reset frames. Additionally, driving at a refresh rate of 1 Hz may involve one frame consisting of a plurality of refresh frames and a plurality of anode reset frames.

The refresh frame charges a new data voltage Vdata, applying new data voltage Vdata to driving transistor DT, while anode reset frame retains and uses data voltage Vdata from previous frame. The anode reset frame may be named a skip or hold period, meaning the process of applying a new data voltage Vdata to the driving transistor DT is omitted.

The pixel driving circuit may eliminate the influence of the data voltage Vdata stored in the previous frame by initializing the gate electrode of the driving transistor DT and the storage capacitor Cst during the refresh frame. Additionally, the pixel driving circuit may eliminate the influence of leakage current by resetting the charge remaining on the anode electrode of the light-emitting element OLED during the refresh frame.

Figure 3:
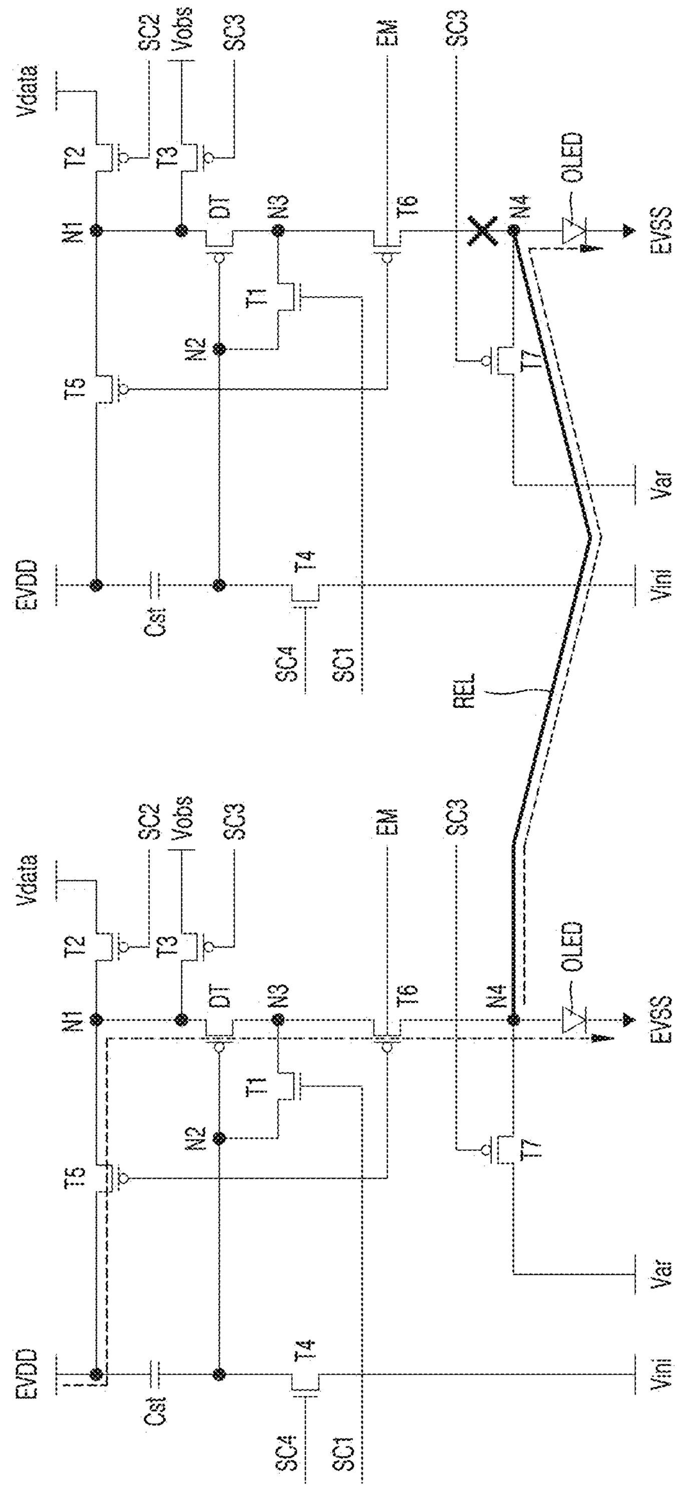
FIG. 3 is a circuit diagram illustrating a defective pixel and a normal pixel connected for repair in an organic light-emitting display apparatus according to an implementation of this disclosure.
Figure 4:
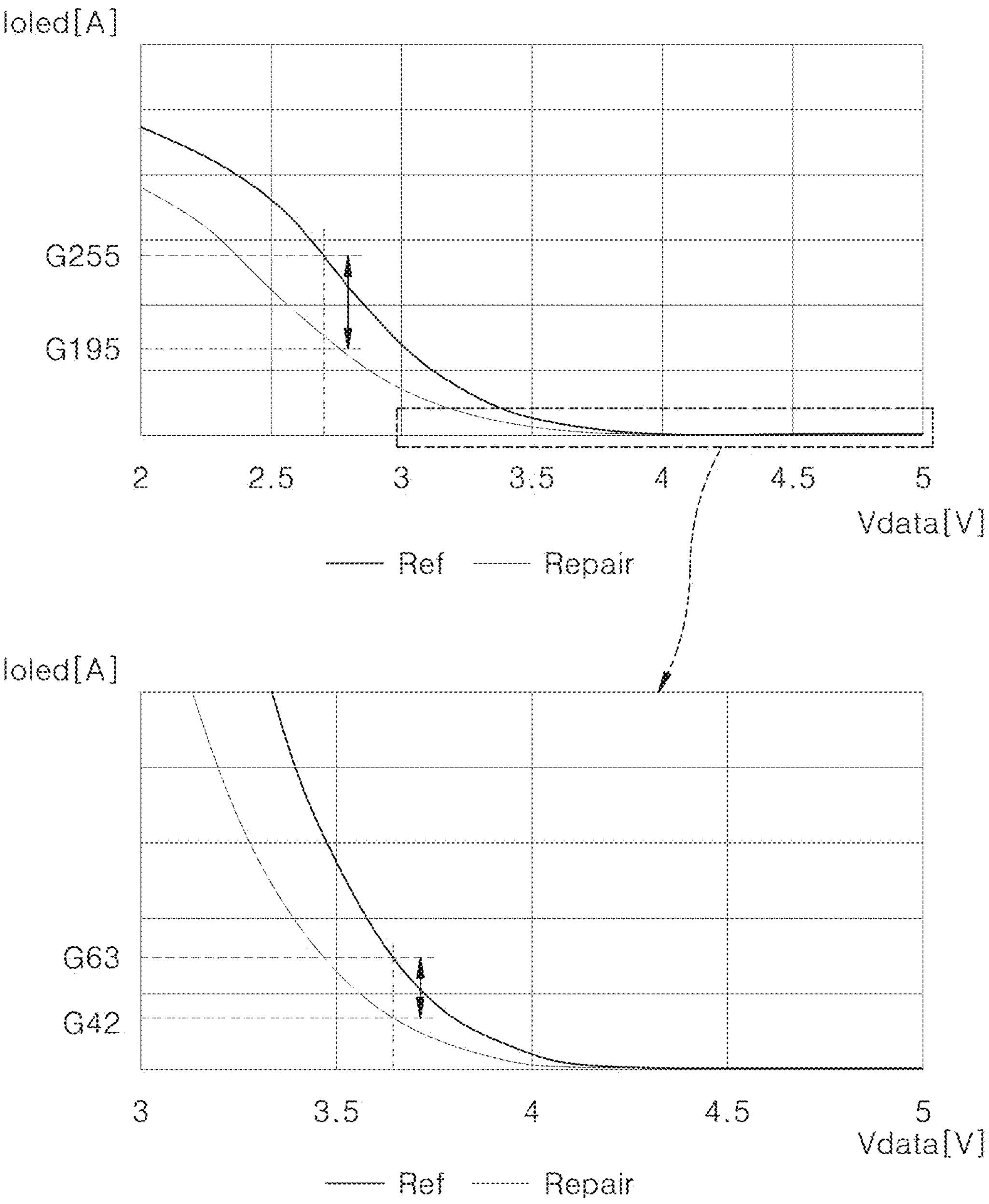
FIG. 4 is a graph for explaining data compensation after repair in the organic light-emitting display apparatus of FIG. 3.

FIG. 3 is a circuit diagram illustrating a defective pixel and a normal pixel connected for repair in an organic light-emitting display apparatus according to an implementation of this disclosure. FIG. 4 is a graph for explaining data compensation after repair in the organic light-emitting display apparatus of FIG. 3.

Referring to FIG. 3 and FIG. 4, when a defect occurs in one pixel among multiple pixels of display panel, node N4 between pixel driving circuit of defective pixel and light-emitting element OLED is cut, anode electrode of light-emitting element OLED of defective pixel connects to repair wiring REL, and anode electrode of light-emitting element OLED of normal pixel of same color adjacent to defective pixel connects to repair wiring REL.

For example, when a defect occurs in a red pixel, repair wiring REL can connect pixel driving circuit of adjacent red pixel to drive light-emitting element of defective pixel. Pixel driving circuit of normal pixel forms a current path from high-potential driving voltage EVDD of normal pixel to low-potential driving voltage EVSS of normal pixel and defective pixel in response to emission control signal EM, causing two light-emitting elements OLED of normal pixel and defective pixel to emit light.

For example, repair wiring REL can be formed overlapping multiple pixels arranged in first direction. Repair wiring REL can electrically connect to anode electrode of light-emitting element OLED of defective pixel through welding and to anode electrode of light-emitting element OLED of adjacent normal pixel through welding. Also, node N4 between anode electrode of light-emitting element OLED of defective pixel and pixel driving circuit can be cut using a laser. That is, anode electrode of light-emitting element OLED of defective pixel and pixel driving circuit can be electrically disconnected.

Additionally, since driving transistor DT of normal pixel must drive light-emitting element OLED of normal pixel and light-emitting element OLED of defective pixel, luminance difference can be compensated by correcting image data. In FIG. 4, "Ref" indicates luminance characteristics according to data voltage in normal pixel, and "Repair" indicates luminance characteristics according to data voltage in defective pixel.

To compensate for characteristic difference between normal pixel and defective pixel, luminance characteristics can be compensated by correcting grayscale of image data. For example, when grayscale of image data of defective pixel is G195, luminance can be compensated by correcting grayscale of image data to G255. Also, when grayscale of image data of defective pixel is G42, luminance may be compensated by correcting grayscale of image data to G63.

Thus, display apparatus according to one implementation can repair light-emitting element of defective pixel by cutting light-emitting element and pixel driving circuit of defective pixel when a defect occurs due to pixel driving circuit fault, and connecting normal pixel of same color adjacent to defective pixel through welding. This improves the yield of the display panel.

Figure 5:
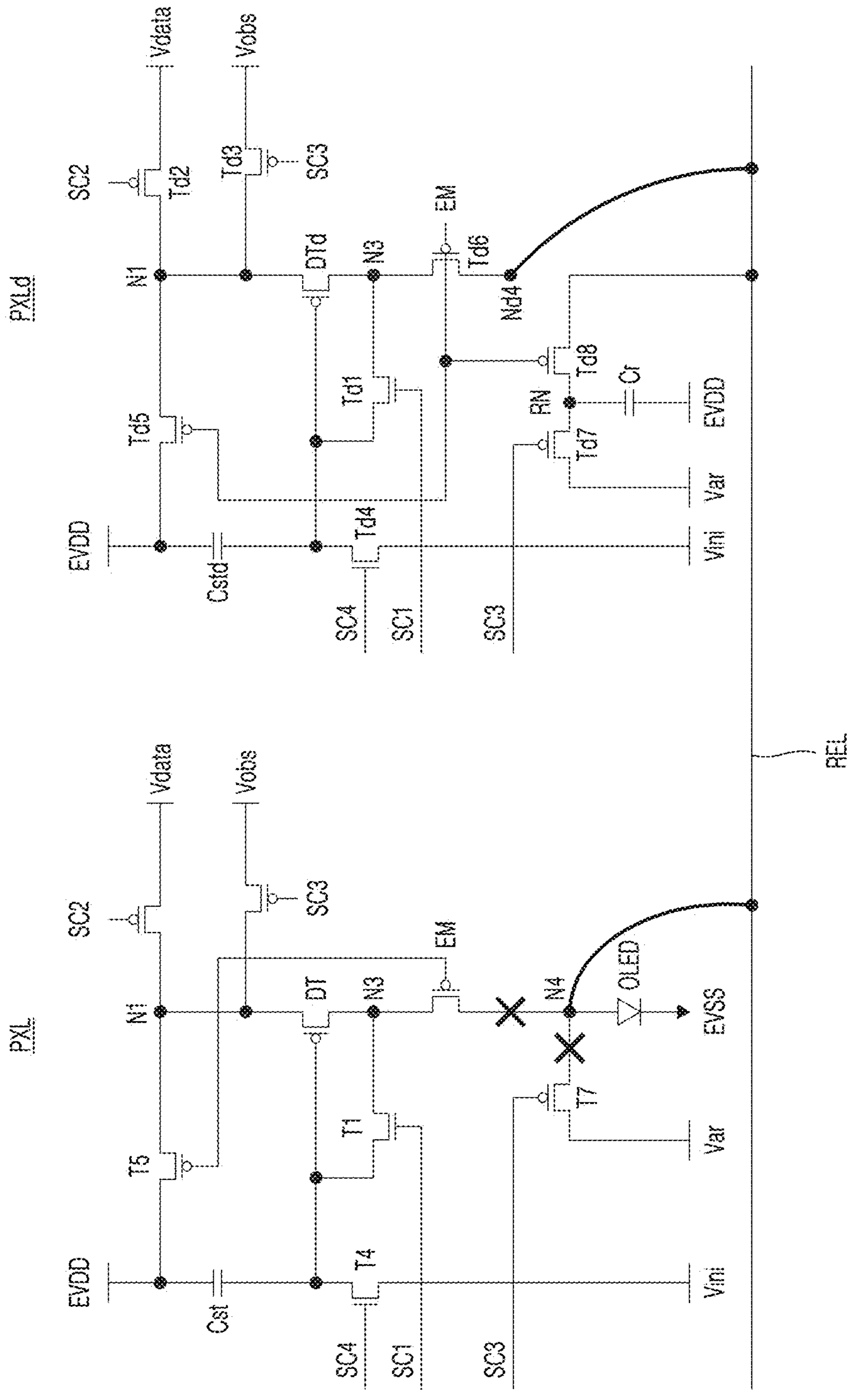
FIG. 5 is a circuit diagram illustrating a defective pixel and a dummy pixel connected for repair in an organic light-emitting display apparatus according to another implementation of this disclosure.
Figure 6:
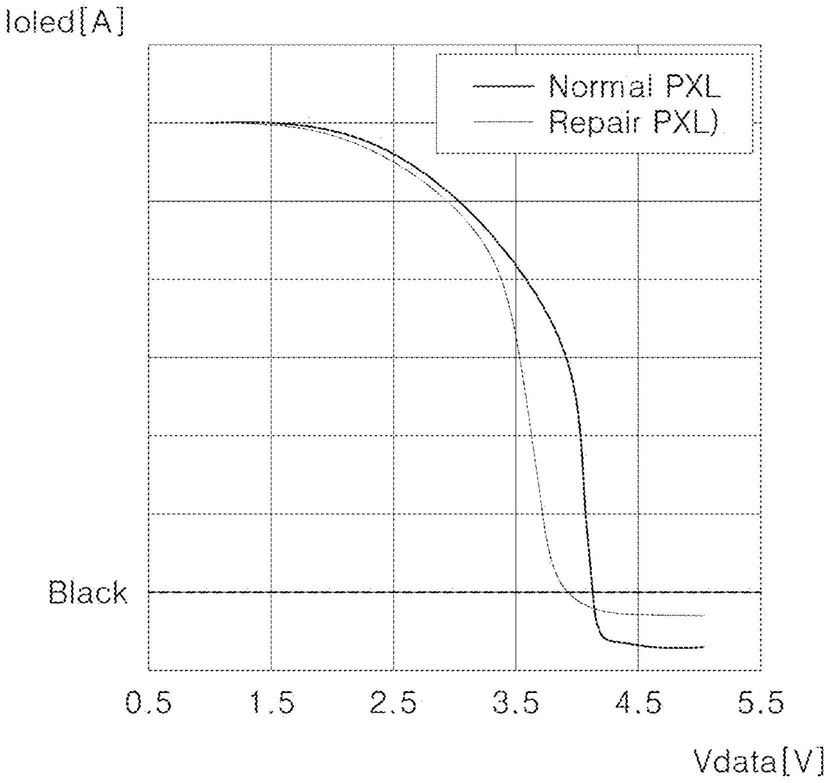
FIG. 6 is a graph illustrating electrical characteristics between a normal pixel and a repaired pixel in the organic light-emitting display apparatus of FIG. 5.
Figure 7:
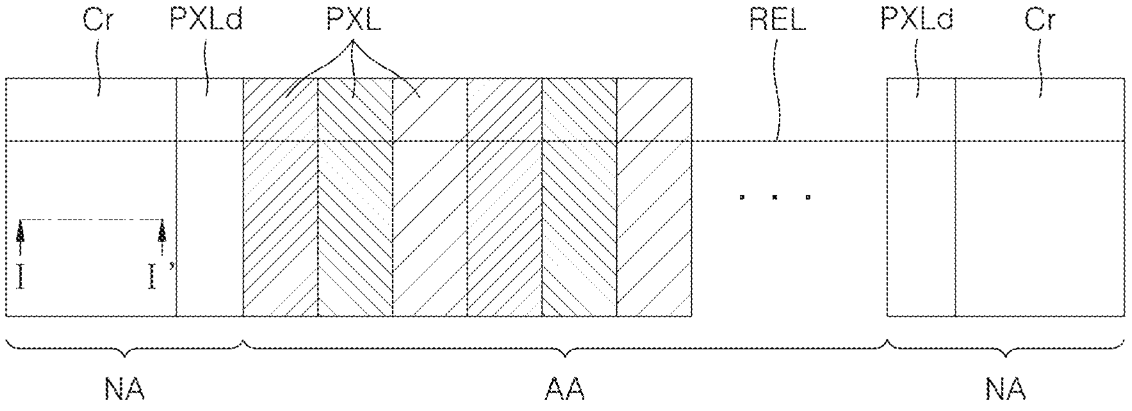
FIG. 7 is a diagram illustrating a display panel of the organic light-emitting display apparatus of FIG. 5.
Figure 8:
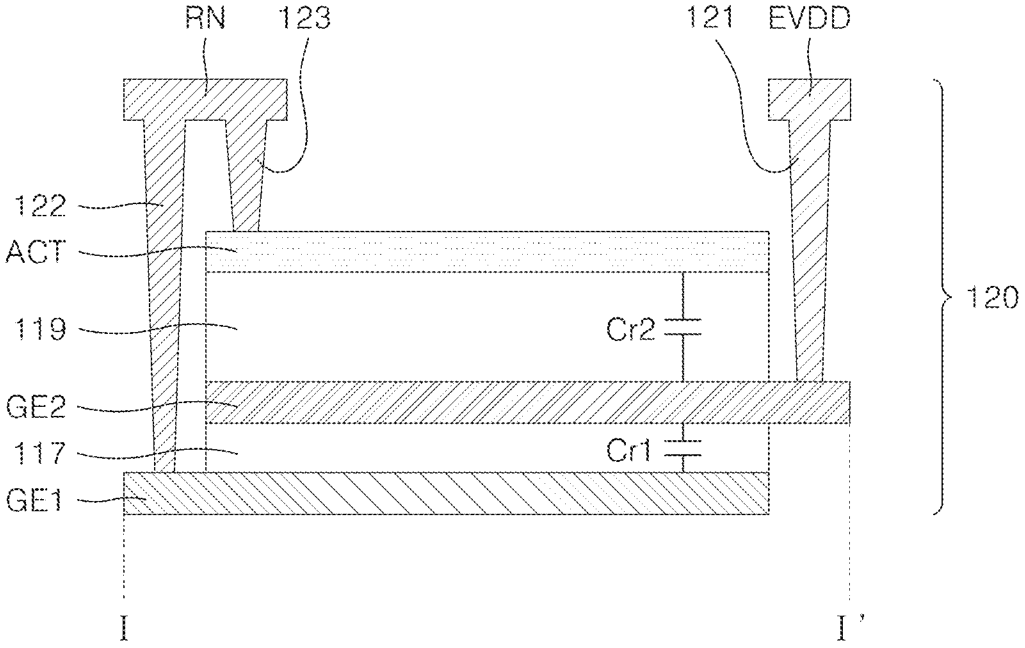
FIG. 8 is a cross-sectional view illustrating a region where a repair capacitor is disposed in FIG. 7, taken along line I-I'.

FIG. 5 is a circuit diagram illustrating a defective pixel and a dummy pixel connected for repair in an organic light-emitting display apparatus according to another implementation of this disclosure. FIG. 6 is a graph illustrating electrical characteristics between a normal pixel and a repaired pixel in the organic light-emitting display apparatus of FIG. 5. FIG. 7 is a diagram illustrating a display panel of the organic light-emitting display apparatus of FIG. 5. FIG. 8 is a cross-sectional view illustrating a region where a repair capacitor is disposed in FIG. 7, taken along line I-I'.

Referring to FIG. 5 and FIG. 7, the display panel includes the active area AA with the multiple pixels PXL, and the non-display area NA on both sides of the active area AA with the dummy pixel PXLd and the reset capacitor Cr. The display panel also includes the repair wiring REL formed overlapping the multiple pixels arranged in the first direction.

FIG. 5 illustrates repairing the defective pixel by connecting the light-emitting element OLED of the defective pixel to the dummy pixel PXLd when a defect occurs in one pixel among a plurality of pixels PXL in the active area AA of FIG. 7. The anode electrode of the light-emitting element OLED of the defective pixel PXL disconnects from the pixel driving circuit of the defective pixel and connects to the repair wiring REL. Also, the dummy anode node Nd4 of the dummy pixel PXLd connects to the repair wiring REL.

The dummy pixel PXLd includes the dummy driving transistor DTd, the dummy storage capacitor Cstd, the first to eighth dummy transistors Td1, Td2, Td3, Td4, Td5, Td6, Td7, and Td8, and the reset capacitor Cr.

The dummy driving transistor DTd and each of the first to eighth dummy transistors Td1, Td2, Td3, Td4, Td5, Td6, Td7, and Td8 may include the first electrode, the second electrode, and the gate electrode. One of the first and second electrodes may be a source electrode, and the other may be a drain electrode.

The dummy driving transistor DTd and each of the first to eighth dummy transistors Td1, Td2, Td3, Td4, Td5, Td6, Td7, and Td8 may be a P-type thin-film transistor or an N-type thin-film transistor. For example, the driving transistor DT, the second, third, fifth, sixth, seventh, and eighth transistors T2, T3, T5, T6, T7, and T8 may be P-type thin-film transistors, and the first and fourth transistors T1 and T4 may be N-type thin-film transistors.

The dummy driving transistor DTd drives the light-emitting element OLED of the defective pixel electrically connected through the repair wiring REL. The dummy storage capacitor Cstd has one electrode connected to the high-potential driving voltage EVDD and the other electrode connected to the gate electrode of the dummy driving transistor DTd. The first dummy transistor Td1 has one electrode connected to the gate electrode of the dummy driving transistor DTd and the other electrode connected to the drain electrode of the dummy driving transistor DTd.

The second dummy transistor Td2 has one electrode connected to the source electrode of the dummy driving transistor DTd and the other electrode connected to the data voltage Vdata. The third dummy transistor Td3 has one electrode connected to the source electrode of the dummy driving transistor DTd and the other electrode connected to the bias voltage Vobs. The fourth dummy transistor Td4 has one electrode connected to the other electrode of the dummy storage capacitor Cstd and the other electrode connected to the initialization voltage Vini.

The fifth dummy transistor Td5 has one electrode connected to the high-potential driving voltage EVDD and the other electrode connected to the source electrode of the dummy driving transistor DTd. The sixth dummy transistor Td6 has one electrode connected to the drain electrode of the dummy driving transistor DTd and the other electrode connected to the dummy anode node Nd4. Here, the dummy anode node Nd4 may be defined as the node connected to the repair wiring REL during repair of the defective pixel and connected to the anode electrode of the light-emitting element OLED of the defective pixel through the repair wiring REL.

The seventh dummy transistor Td7 has one electrode connected to the anode reset voltage Var and the other electrode connected to the dummy reset node RN. The seventh dummy transistor Td7 may operate in response to the scan signal SC3 activated during the period for resetting the anode electrodes of a plurality of pixels.

The reset capacitor Cr has one electrode connected to the dummy reset node RN and the other electrode connected to the high-potential driving voltage EVDD. For example, the reset capacitor Cr may be designed to have a capacitance value of 10% or more of the parasitic capacitor of the repair wiring REL.

In the implementation of FIG. 7, the reset capacitor Cr is illustrated with one electrode connected to the dummy reset node RN and the high-potential driving voltage EVDD applied to the other electrode, but the configuration is not limited to the example. A constant voltage may be applied to the other electrode of the reset capacitor Cr instead of the high-potential driving voltage EVDD. For example, the constant voltage applied to the reset capacitor Cr may be the initialization voltage Vini or the reset voltage Var supplied to the pixel circuit. Alternatively, the constant voltage applied to the reset capacitor Cr may be a separate DC voltage.

Referring to FIGS. 7 and 8, the non-display area NA is disposed on both sides of the active area AA. The non-display area NA includes the area where the dummy pixel PXLd is disposed and the area where the reset capacitor Cr is disposed. FIG. 8 is a cross-sectional view illustrating the I-I' of the area where the reset capacitor Cr is disposed.

The reset capacitor Cr may include the first capacitor Cr1 and the second capacitor Cr2 connected in parallel to reduce the design area. For example, the first capacitor Cr1 may have one electrode connected to the gate electrode layer GE1 formed in the thin-film transistor array portion 120 of the display panel and the other electrode connected to the first metal layer GE2 formed in the thin-film transistor array portion 120. The interlayer insulating layer 117 may be disposed between the gate electrode layer GE1 and the first metal layer GE2.

The second capacitor Cr2 may have one electrode connected to the first metal layer GE2 and the other electrode connected to the second metal layer ACT formed in the thin-film transistor array portion 120. The buffer layer 119 may be disposed between the first metal layer GE2 and the second metal layer ACT. The first metal layer GE2 may be connected to the high-potential driving voltage EVDD through the first contact hole 121. The gate electrode layer GE1 may be connected to the dummy reset node RN through the second contact hole 122. The active layer may be connected to the dummy reset node RN through the third contact hole 123. In the implementation of FIG. 8, the high-potential driving voltage EVDD is illustrated as being applied to the first metal layer GE2, but the configuration is not limited to the example. A constant voltage may be applied to the first metal layer GE2. For example, the initialization voltage Vini or the reset voltage Var may be applied to the first metal layer GE2. In the implementation of FIG. 8, the second metal layer ACT may be the oxide active layer of low-temperature polycrystalline oxide (LTPO). In the implementation of FIG. 8, the second metal layer ACT is illustrated as the oxide active layer, but the configuration is not limited to the example. The second metal layer ACT may be a gate electrode or another metal layer.

The eighth dummy transistor Td8 has one electrode connected to the dummy reset node RN and the other electrode connected to the repair wiring REL. The eighth dummy transistor Td8 may operate in response to the emission control signal EM activated during the period for causing the light-emitting elements OLED of a plurality of pixels to emit light.

The display apparatus, when designed with the capacity of the reset capacitor Cr at 10% or more of the parasitic capacitor of the repair wiring REL, may reduce the difference in the luminance characteristics between the normal pixel and the repaired pixel according to the data voltage, as shown in FIG. 6. Also, the display apparatus may reduce the difference in the luminance variation between the normal pixel and the repaired pixel when switching from the high grayscale to the low grayscale.

Thus, the display apparatus includes the dummy pixel PXLd for repairing the defective pixel, and the dummy pixel PXLd includes the seventh and eighth dummy transistors Td7 and Td8 for controlling the reset of the repair wiring REL and the reset capacitor with a capacity of at least 10% of the capacity of the repair wiring REL, enabling the reset of the repair wiring REL by the appropriate capacity.

That is, the display apparatus may reduce the difference in the luminance characteristics between the normal pixel and the repaired pixel according to the data voltage by controlling the reset of the repair wiring, making the pixel robust to the data voltage variations.

Also, the display apparatus may improve the yield through the repair of the defective pixel by cutting and welding between the dummy pixel designed on the left and right of the active area AA and the defective pixel upon the occurrence of the defective pixel. Also, the display apparatus may resolve the issue of the defective pixel exposure when displaying the vertical pattern, such as the alternating black and white vertical pattern.

Also, the display apparatus may reduce the difference in the luminance characteristics between the normal pixel and the repaired pixel according to the data voltage through the reset capacitor even when the defective pixel is included in the specific pattern, making the pixel robust to the data voltage variations.

Figure 9:
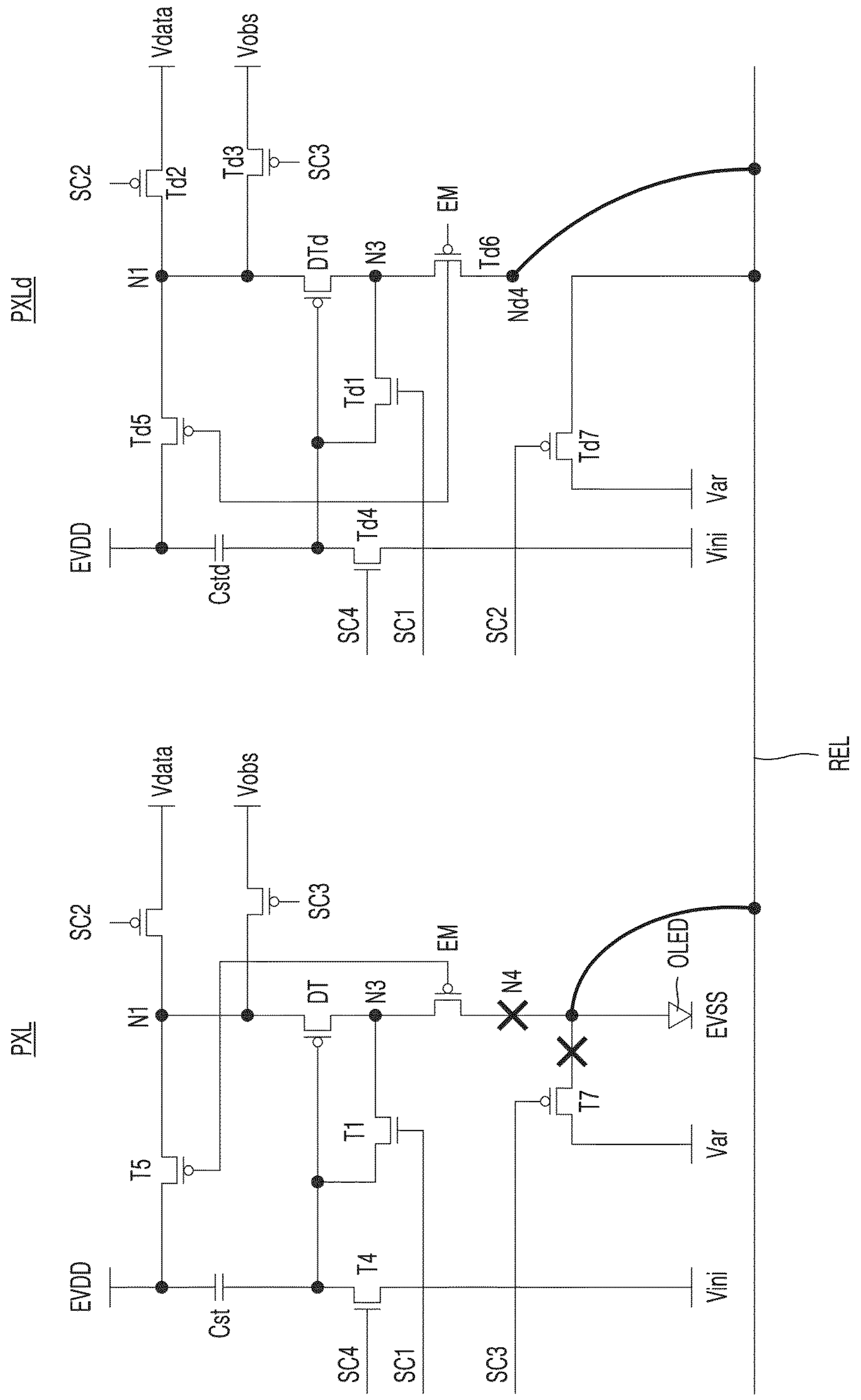
FIG. 9 is a circuit diagram illustrating a defective pixel and a dummy pixel connected for repair in an organic light-emitting display apparatus according to another implementation of this disclosure.
Figure 10:
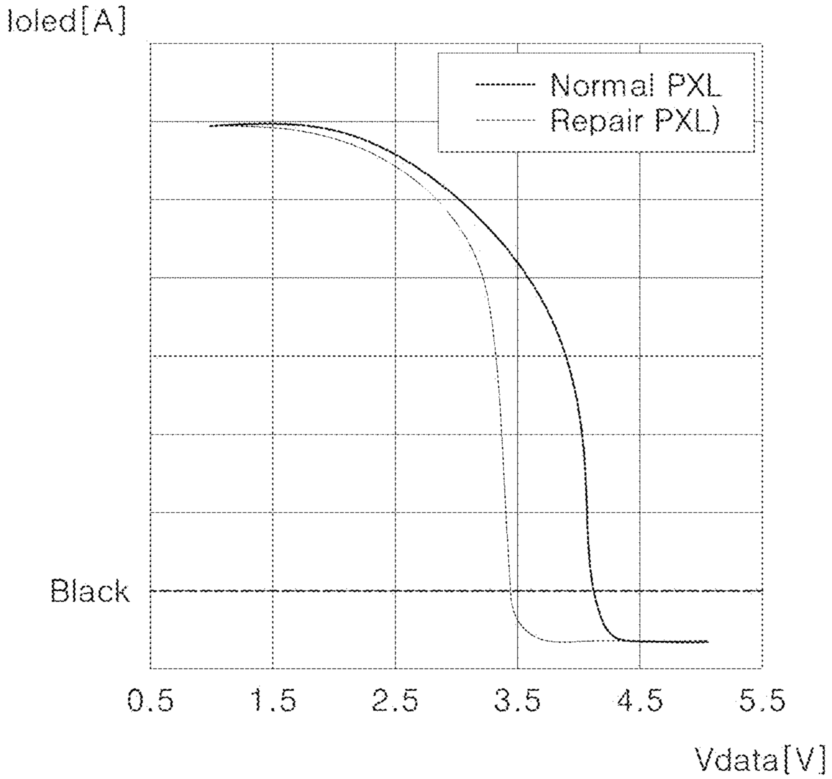
FIG. 10 is a graph illustrating electrical characteristics between a normal pixel and a repair pixel in the organic light-emitting display apparatus of FIG. 9.
Figure 11:
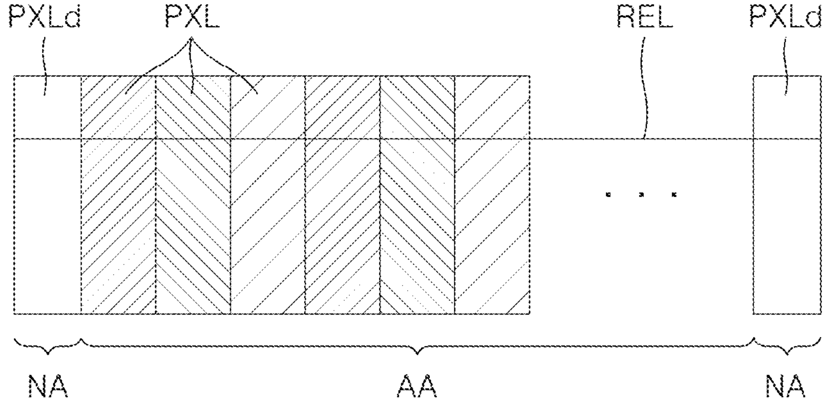
FIG. 11 is a diagram illustrating a display panel of the organic light-emitting display apparatus of FIG. 9.

FIG. 9 is a circuit diagram illustrating a defective pixel and a dummy pixel connected for repair in an organic light-emitting display apparatus according to another implementation of this disclosure. FIG. 10 is a graph illustrating electrical characteristics between a normal pixel and a repair pixel in the organic light-emitting display apparatus of FIG. 9. FIG. 11 is a diagram illustrating a display panel of the organic light-emitting display apparatus of FIG. 9.

Referring to FIGS. 9 to 11, the display panel includes the active area AA with a plurality of pixels PXL, and the non-display area NA on both sides of the active area AA with the dummy pixel PXLd. Additionally, the display panel includes a repair wiring REL formed to overlap with a plurality of pixels arranged in a first direction.

FIG. 9 illustrates repairing the defective pixel by connecting the light-emitting element OLED of the defective pixel to the dummy pixel PXLd when a defect occurs in one pixel among a plurality of pixels PXL in the active area AA of FIG. 11. The anode electrode of the light-emitting element OLED of the defective pixel PXL disconnects from the pixel driving circuit of the defective pixel and connects to the repair wiring REL. Also, the dummy anode node Nd4 of the dummy pixel PXLd connects to the repair wiring REL.

Referring to FIG. 9, the dummy pixel PXLd includes the dummy driving transistor DTd, the dummy storage capacitor Cstd, and the first to seventh dummy transistors Td1, Td2, Td3, Td4, Td5, Td6, and Td7.

The dummy driving transistor DTd and each of the first to seventh dummy transistors Td1, Td2, Td3, Td4, Td5, Td6, and Td7 may include the first electrode, the second electrode, and the gate electrode. One of the first and second electrodes may be a source electrode, and the other may be a drain electrode.

The dummy driving transistor DTd and each of the first to seventh dummy transistors Td1, Td2, Td3, Td4, Td5, Td6, and Td7 may be a P-type thin-film transistor or an N-type thin-film transistor. For example, the driving transistor DT, the second, third, fifth, sixth, and seventh transistors T2, T3, T5, T6, and T7 may be P-type thin-film transistors, and the first and fourth transistors T1 and T4 may be N-type thin-film transistors.

The dummy driving transistor DTd is used to drive the light-emitting element OLED of the defective pixel electrically connected through the repair wiring REL. The dummy storage capacitor Cstd has one electrode connected to the high-potential driving voltage EVDD and the other electrode connected to the gate electrode of the dummy driving transistor DTd. The first dummy transistor Td1 has one electrode connected to the gate electrode of the dummy driving transistor DTd and the other electrode connected to the drain electrode of the dummy driving transistor DTd.

The second dummy transistor Td2 has one electrode connected to the source electrode of the dummy driving transistor DTd and the other electrode connected to the data voltage Vdata. The third dummy transistor Td3 has one electrode connected to the source electrode of the dummy driving transistor DTd and the other electrode connected to the bias voltage Vobs. The fourth dummy transistor Td4 has one electrode connected to the other electrode of the dummy storage capacitor Cstd and the other electrode connected to the initialization voltage Vini.

The fifth dummy transistor Td5 has one electrode connected to the high-potential driving voltage EVDD and the other electrode connected to the source electrode of the dummy driving transistor DTd. The sixth dummy transistor Td6 has one electrode connected to the drain electrode of the dummy driving transistor DTd and the other electrode connected to the dummy anode node Nd4. Here, the dummy anode node Nd4 may be defined as the node connected to the repair wiring REL during repair of the defective pixel and connected to the anode electrode of the light-emitting element OLED of the defective pixel through the repair wiring REL.

The seventh dummy transistor Td7 has one electrode connected to the anode reset voltage Var and the other electrode connected to the dummy reset node RN. The seventh dummy transistor Td7 may operate in response to the scan signal SC2 activated during the period for sampling the data voltage. Alternatively, the seventh dummy transistor Td7 may operate in response to the scan signal activated for a period shorter than the period for resetting the anode electrode of the light-emitting element OLED.

Thus, the display apparatus may control the turn-on time of the seventh dummy transistor Td7 to maintain the charge remaining in the repair wiring REL at a level above a certain threshold. Also, the display apparatus may control the charge remaining in the repair wiring REL to be maintained at a level above a certain threshold by designing the performance of the seventh dummy transistor Td7, for example, with a narrower channel width or a longer channel length compared to other thin-film transistors.

The display apparatus designed in this way may reduce the difference in the luminance characteristics between the normal pixel and the repaired pixel according to the data voltage, as shown in FIG. 10. Also, the display apparatus may reduce the difference in the luminance variation between the normal pixel and the repaired pixel when switching from the high grayscale to the low grayscale.

Thus, the display apparatus includes the dummy pixel PXLd for repairing the defective pixel, and the dummy pixel PXLd includes the seventh dummy transistor Td7 with a controlled activation time to reset the repair wiring REL, enabling the repair wiring REL to be reset for an appropriate duration.

Also, the display apparatus may reduce the difference in the luminance characteristics between the normal pixel and the repaired pixel according to the data voltage by controlling the reset of the repair wiring REL, making the pixel robust to data voltage variations.

Also, the display apparatus may reduce the difference in the luminance characteristics between the repaired pixel and the normal pixel according to the data voltage by controlling the reset time to reset the repair wiring REL, even when a defect occurs in a pixel located in the middle of the active area AA of the display panel.

Also, the present disclosure may prevent the occurrence of dark spots or bright spots due to the defective pixel by reducing the difference in the luminance characteristics between the repaired pixel and the normal pixel according to the data voltage.

Also, the display apparatus may reduce the difference in the luminance characteristics between the repaired pixel and the normal pixel according to the data voltage, preventing the defective pixel from being perceived and improving image quality.

Figure 12:
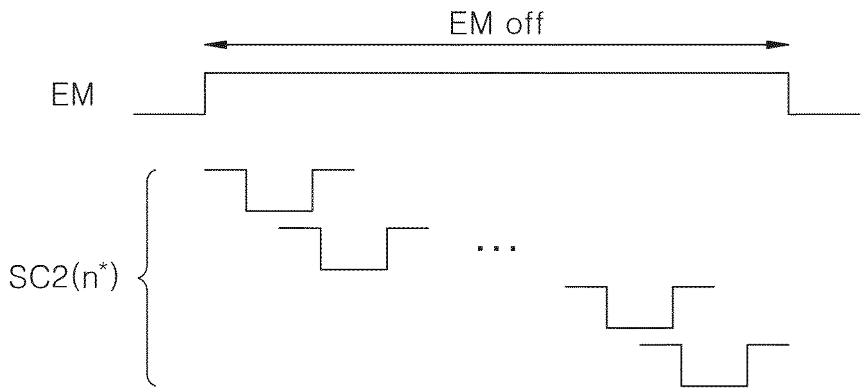
FIG. 12 is a diagram illustrating an example of a scan signal applied to a seventh dummy transistor in the organic light-emitting display apparatus of FIG. 9.

FIG. 12 is a diagram illustrating an example of the scan signal applied to the seventh dummy transistor Td7 in the organic light-emitting display apparatus of FIG. 9.

Referring to FIG. 12, the scan signal applied to the seventh dummy transistor Td7 may be the second scan signal SC2($n^*$) applied during the period when the emission control signal EM is off. For example, the second scan signal SC2($n^*$) may be the second scan signal applied during the period when the emission control signal EM is off for the $n^{th}$, or $(n-1)^{th}$, or $(n+1)^{th}$, etc.

Figure 13:
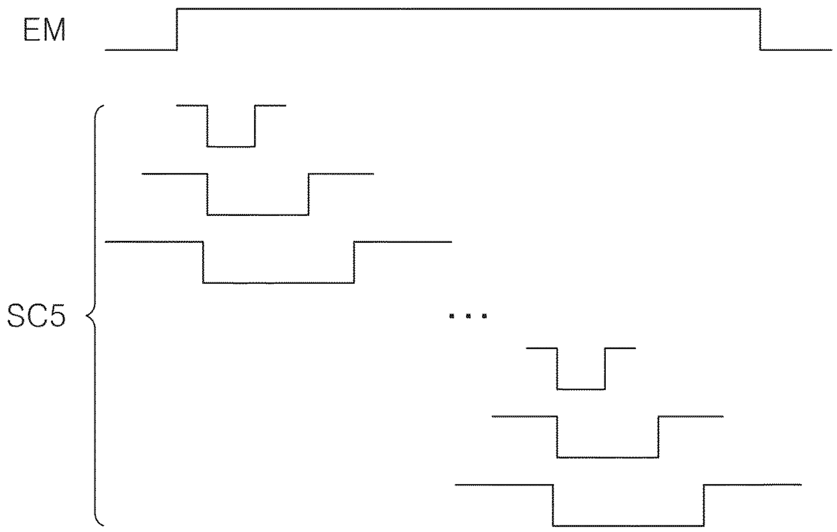
FIG. 13 is a diagram illustrating another example of a scan signal applied to a seventh dummy transistor in the organic light-emitting display apparatus of FIG. 9.

FIG. 13 is a diagram illustrating another example of the scan signal applied to the seventh dummy transistor Td7 in the organic light-emitting display apparatus of FIG. 9.

Referring to FIG. 13, the scan signal applied to the seventh dummy transistor Td7 may be a separate fifth scan signal SC5 applied during the period when the emission control signal EM is off. Here, the pulse width of the fifth scan signal SC5 may vary depending on the position of the defective pixel. For example, the pulse width of the fifth scan signal may be the smallest when the defective pixel is located in the center of the active area AA farthest from the dummy pixel area. Also, the pulse width of the fifth scan signal may increase as the distance between the dummy pixel area and the defective pixel position decreases. The pulse width of the fifth scan signal may be designed to be smaller than the pulse width of the third scan signal SC3 for resetting the anode electrode of the normal pixel.

Figure 14:
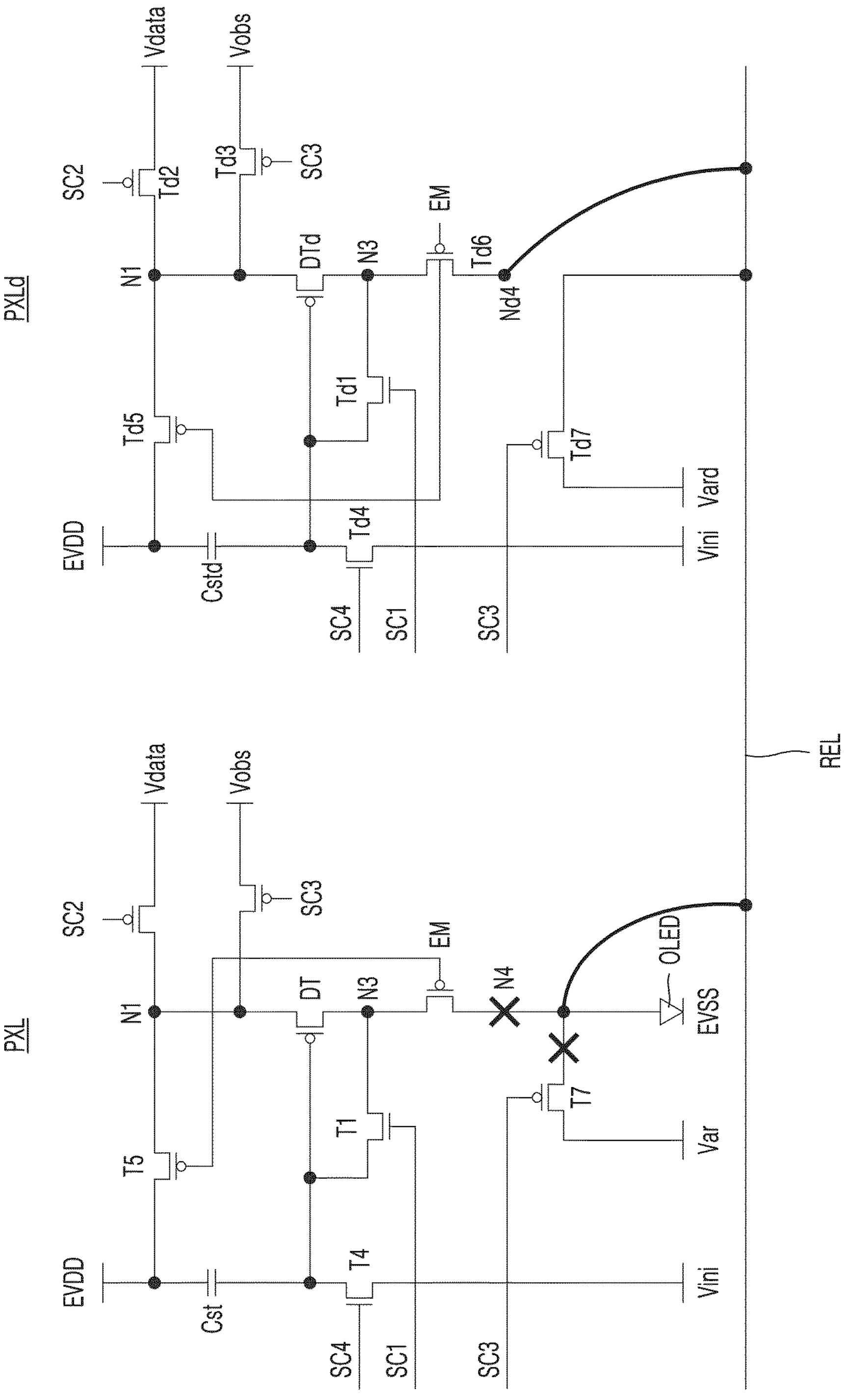
FIG. 14 is a circuit diagram illustrating a defective pixel and a dummy pixel connected for repair in an organic light-emitting display apparatus according to another implementation of this disclosure.

FIG. 14 is a circuit diagram illustrating a defective pixel and a dummy pixel connected for repair in an organic light-emitting display apparatus according to another implementation of this disclosure. In describing the implementation of FIG. 14, the description of components identical or corresponding to those in the implementation of FIG. 9 is omitted.

Referring to FIG. 14, the dummy reset voltage Vard applied through the seventh dummy transistor Td7 of the dummy pixel PXLd may be applied at a different level from the reset voltage Var applied to the pixel PXL in the active area. For example, the dummy reset voltage Vard of the dummy pixel PXLd may be applied at a higher level than the reset voltage Var of the pixel PXL. Also, the seventh dummy transistor Td7 of the dummy pixel PXLd may operate in response to the third scan signal SC3, similar to the seventh transistor T7 of the pixel PXL.

A display apparatus according to an implementation of this disclosure includes a display panel including a plurality of pixels, a plurality of dummy pixels, and a repair wiring, wherein the plurality of dummy pixels includes a dummy driving transistor configured to drive a light-emitting element of a defective pixel among the plurality of pixels, a first dummy transistor connected between a reset voltage and a dummy reset node, a reset capacitor connected between the dummy reset node and a high-potential driving voltage, the reset capacitor having a capacitance value equal to or greater than a reference value relative to a capacitance of the repair wiring, and a second dummy transistor connected between the dummy reset node and the repair wiring.

According to some implementations of this disclosure, an anode electrode of a light-emitting element of the defective pixel may be disconnected from a pixel driving circuit of the defective pixel and connected to the repair wiring, and a dummy anode node of a dummy pixel may be connected to the repair wiring.

According to some implementations of this disclosure, the dummy anode node of the dummy pixel may be connected to the repair wiring to allow a driving current controlled by the dummy driving transistor to be transmitted to the repair wiring.

According to some implementations of this disclosure, the first dummy transistor may operate in response to a scan signal activated during a period for resetting anode electrodes of the plurality of pixels.

According to some implementations of this disclosure, the second dummy transistor may operate in response to an emission control signal activated during a period for causing light-emitting elements of the plurality of pixels to emit light.

According to some implementations of this disclosure, the reset capacitor may have a capacitance value of 10% or more of a parasitic capacitor of the repair wiring.

According to some implementations of this disclosure, the reset capacitor may include a first capacitor and a second capacitor connected in parallel.

According to some implementations of this disclosure, the first capacitor may have one electrode connected to a gate electrode layer formed in a thin-film transistor array portion of the display panel and the other electrode connected to a first metal layer formed in the thin-film transistor array portion, the second capacitor may have one electrode connected to the first metal layer and the other electrode connected to a second metal layer formed in the thin-film transistor array portion, the first metal layer may be connected to the constant voltage, and the gate electrode layer and the second metal layer may be connected to the dummy reset node.

A display apparatus according to another implementation of this disclosure includes a display panel including a plurality of pixels, a plurality of dummy pixels, and a repair wiring, wherein the plurality of dummy pixels includes a dummy driving transistor configured to drive a light-emitting element of a defective pixel among the plurality of pixels, and a first dummy transistor connected between the repair wiring and a reset voltage, the first dummy transistor having a controlled activation time for resetting the repair wiring.

According to some implementations of this disclosure, an anode electrode of a light-emitting element of the defective pixel may be disconnected from a pixel driving circuit of the defective pixel and connected to the repair wiring, and a dummy anode node of a dummy pixel may be connected to the repair wiring.

According to some implementations of this disclosure, the dummy anode node of the dummy pixel may be connected to the repair wiring to allow a driving current controlled by the dummy driving transistor to be transmitted to the repair wiring.

According to some implementations of this disclosure, the first dummy transistor may operate in response to a scan signal activated during a period for sampling a data voltage.

According to some implementations of this disclosure, the first dummy transistor may operate in response to a scan signal activated for a period shorter than a period for resetting an anode electrode of a light-emitting element.

A display apparatus according to another implementation of this disclosure includes a display panel including a plurality of pixels, a plurality of dummy pixels, and a repair wiring, wherein the plurality of dummy pixels includes a dummy driving transistor configured to drive a light-emitting element of a defective pixel among the plurality of pixels, a dummy storage capacitor with one electrode connected to a high-potential driving voltage and the other electrode connected to a gate electrode of the dummy driving transistor, a first dummy transistor with one electrode connected to the gate electrode of the dummy driving transistor and the other electrode connected to a drain electrode of the dummy driving transistor, a second dummy transistor with one electrode connected to a source electrode of the dummy driving transistor and the other electrode connected to a data voltage, a third dummy transistor with one electrode connected to the source electrode of the dummy driving transistor and the other electrode connected to a bias voltage, a fourth dummy transistor with one electrode connected to the other electrode of the dummy storage capacitor and the other electrode connected to an initialization voltage, a fifth dummy transistor with one electrode connected to the high-potential driving voltage and the other electrode connected to the source electrode of the dummy driving transistor, a sixth dummy transistor with one electrode connected to the drain electrode of the dummy driving transistor and the other electrode connected to a dummy anode node, a seventh dummy transistor with one electrode connected to a reset voltage and the other electrode connected to a dummy reset node, a reset capacitor with one electrode connected to the dummy reset node and the other electrode connected to the constant voltage, and an eighth dummy transistor with one electrode connected to the dummy reset node and the other electrode connected to the repair wiring.

According to some implementations of this disclosure, an anode electrode of a light-emitting element of the defective pixel may be disconnected from a pixel driving circuit of the defective pixel and connected to the repair wiring, and a dummy anode node of a dummy pixel may be connected to the repair wiring.

According to some implementations of this disclosure, the seventh dummy transistor may operate in response to a scan signal activated during a period for resetting an anode electrode of a light-emitting element.

According to some implementations of this disclosure, the eighth dummy transistor may operate in response to an emission control signal activated during a period for causing a light-emitting element to emit light.

According to some implementations of this disclosure, the reset capacitor may have a capacitance value of 10% or more of a parasitic capacitor of the repair wiring.

A display apparatus according to another implementation of this disclosure includes a display panel including a plurality of pixels, a plurality of dummy pixels, and a repair wiring, wherein the plurality of dummy pixels includes a dummy driving transistor configured to drive a light-emitting element of a defective pixel among the plurality of pixels, a dummy storage capacitor with one electrode connected to a high-potential driving voltage and the other electrode connected to a gate electrode of the dummy driving transistor, a first dummy transistor with one electrode connected to the gate electrode of the dummy driving transistor and the other electrode connected to a drain electrode of the dummy driving transistor, a second dummy transistor with one electrode connected to a source electrode of the dummy driving transistor and the other electrode connected to a data voltage, a third dummy transistor with one electrode connected to the source electrode of the dummy driving transistor and the other electrode connected to a bias voltage, a fourth dummy transistor with one electrode connected to the other electrode of the dummy storage capacitor and the other electrode connected to an initialization voltage, a fifth dummy transistor with one electrode connected to the high-potential driving voltage and the other electrode connected to the source electrode of the dummy driving transistor, a sixth dummy transistor with one electrode connected to the drain electrode of the dummy driving transistor and the other electrode connected to a dummy anode node, and a seventh dummy transistor with one electrode connected to a reset voltage and the other electrode connected to the repair wiring.

According to some implementations of this disclosure, an anode electrode of a light-emitting element of the defective pixel may be disconnected from a pixel driving circuit of the defective pixel and connected to the repair wiring, a dummy anode node of a dummy pixel may be connected to the repair wiring, and the seventh dummy transistor may operate in response to a scan signal activated for a period shorter than a period for resetting an anode electrode of a light-emitting element.

A display apparatus according to the implementations of this disclosure is advantageous for resetting a repair line with an appropriate capacitance using a dummy pixel for repairing a defective pixel, the dummy pixel including a dummy transistor for controlling the reset of the repair line and a reset capacitor with a capacitance greater than a reference value relative to the capacitance of the repair line.

Additionally, the display apparatus is advantageous for resetting a repair line for an appropriate duration using a dummy pixel for repairing a defective pixel, the dummy pixel including a dummy transistor with a controlled activation time for resetting the repair line.

Furthermore, the display apparatus is advantageous for reducing the difference in luminance characteristics due to data voltage between normal pixels and repaired pixels, regardless of the location of defective pixels in the active area, by controlling the reset of the repair line, making pixels robust against data voltage variations.

Moreover, the display apparatus is advantageous for repairing the light-emitting element of a defective pixel by cutting the light-emitting element and the pixel driving circuit of the defective pixel and connecting it to an adjacent normal pixel of the same color through welding, when a defective pixel occurs due to a defect in the pixel driving circuit.

Additionally, the display apparatus is advantageous for improving the yield of the display panel by driving the light-emitting element of a defective pixel using the dummy pixel.

Furthermore, the display apparatus is advantageous for reducing the difference in luminance characteristics due to data voltage between repaired pixels and normal pixels, even when a defect occurs in a pixel located in the middle of the active area of the display panel, by resetting the repair line with an appropriate capacitance.

Additionally, the display apparatus is advantageous for reducing the difference in luminance characteristics due to data voltage between repaired pixels and normal pixels, even when a defect occurs in a pixel located in the middle of the active area of the display panel, by controlling the reset time of the repair line.

Moreover, the display apparatus is advantageous for improving image quality by preventing the perception of defective pixels, by reducing the difference in luminance characteristics due to data voltage between repaired pixels and normal pixels.

In addition to the aforementioned effects, other advantageous effects of the present disclosure will be provided along with the detailed description of the disclosure.

Although implementations of this disclosure have been described in detail with reference to the accompanying drawings, it should be noted that the disclosure is not necessarily limited to these implementations and can be modified in various ways without departing from the scope of the technical concept of the disclosure. Therefore, the implementations disclosed in this disclosure are not intended to limit but to describe the technical idea of the disclosure, and the scope of the technical idea of the disclosure is not limited by the implementations. Therefore, it should be understood that the implementations described above are examples and not limited in all aspects. The scope of protection of technical ideas of the present disclosure shall be construed by the following claims, and all technical ideas within the scope equivalent thereto shall be construed as being within the scope of the rights of the present disclosure.

What is claimed is:

1. A display apparatus comprising:

a display panel comprising a plurality of pixels, a plurality of dummy pixels, and a repair wiring, wherein the plurality of dummy pixels comprises:

a dummy driving transistor configured to drive a light-emitting element of a defective pixel among the plurality of pixels;

a first dummy transistor connected between a reset voltage and a dummy reset node;

a reset capacitor connected between the dummy reset node and a constant voltage, the reset capacitor having a capacitance value equal to or greater than a reference value relative to a capacitance of the repair wiring; and a second dummy transistor connected between the dummy reset node and the repair wiring, wherein the first dummy transistor operates in response to a scan signal activated during a period for resetting anode electrodes of the plurality of pixels, and wherein the second dummy transistor operates in response to an emission control signal activated during a period for causing light-emitting elements of the plurality of pixels to emit light.

2. The display apparatus of claim 1, wherein an anode electrode of a light-emitting element of the defective pixel is disconnected from a pixel driving circuit of the defective pixel and connected to the repair wiring, and a dummy anode node of a dummy pixel is connected to the repair wiring.

3. The display apparatus of claim 2, wherein the dummy anode node of the dummy pixel is connected to the repair wiring to allow a driving current controlled by the dummy driving transistor to be transmitted to the repair wiring.

4. The display apparatus of claim 1, wherein the reset capacitor has a capacitance value of 10% or more of a parasitic capacitor of the repair wiring.

5. The display apparatus of claim 4, wherein the reset capacitor comprises a first capacitor and a second capacitor connected in parallel.

6. The display apparatus of claim 5, wherein the first capacitor has one electrode connected to a gate electrode layer formed in a thin-film transistor array portion of the display panel and the other electrode connected to a first metal layer formed in the thin-film transistor array portion, the second capacitor has one electrode connected to the first metal layer and the other electrode connected to a second metal layer formed in the thin-film transistor array portion, the first metal layer is connected to the constant voltage, and the gate electrode layer and the second metal layer are connected to the dummy reset node.

7. A display apparatus comprising a display panel comprising a plurality of pixels, a plurality of dummy pixels, and a repair wiring, wherein the plurality of dummy pixels comprises:

a dummy driving transistor configured to drive a light-emitting element of a defective pixel among the plurality of pixels;

a first dummy transistor connected between a dummy reset node and a reset voltage, the first dummy transistor having a controlled activation time for resetting the repair wiring; and a second dummy transistor connected between the dummy reset node and the repair wiring, wherein the second dummy transistor operates in response to an emission control signal activated during a period for causing light-emitting elements of the plurality of pixels to emit light.

8. The display apparatus of claim 7, wherein an anode electrode of a light-emitting element of the defective pixel is disconnected from a pixel driving circuit of the defective pixel and connected to the repair wiring, and a dummy anode node of a dummy pixel is connected to the repair wiring.

9. The display apparatus of claim 8, wherein the dummy anode node of the dummy pixel is connected to the repair wiring to allow a driving current controlled by the dummy driving transistor to be transmitted to the repair wiring.

10. The display apparatus of claim 7, wherein the first dummy transistor operates in response to a scan signal activated during a period for sampling a data voltage.

11. The display apparatus of claim 7, wherein the first dummy transistor operates in response to a scan signal activated for a period shorter than a period for resetting an anode electrode of a light-emitting element.

12. A display apparatus comprising:

a display panel comprising a plurality of pixels, a plurality of dummy pixels, and a repair wiring, wherein the plurality of dummy pixels comprises:

a dummy driving transistor configured to drive a light-emitting element of a defective pixel among the plurality of pixels;

a dummy storage capacitor with one electrode connected to a high-potential driving voltage and the other electrode connected to a gate electrode of the dummy driving transistor;

a first dummy transistor with one electrode connected to the gate electrode of the dummy driving transistor and the other electrode connected to a drain electrode of the dummy driving transistor;

a second dummy transistor with one electrode connected to a source electrode of the dummy driving transistor and the other electrode connected to a data voltage;

a third dummy transistor with one electrode connected to the source electrode of the dummy driving transistor and the other electrode connected to a bias voltage;

a fourth dummy transistor with one electrode connected to the other electrode of the dummy storage capacitor and the other electrode connected to an initialization voltage;

a fifth dummy transistor with one electrode connected to the high-potential driving voltage and the other electrode connected to the source electrode of the dummy driving transistor;

a sixth dummy transistor with one electrode connected to the drain electrode of the dummy driving transistor and the other electrode connected to a dummy anode node;

a seventh dummy transistor with one electrode connected to a reset voltage and the other electrode connected to a dummy reset node;

a reset capacitor with one electrode connected to the dummy reset node and the other electrode connected to a constant voltage; and an eighth dummy transistor with one electrode connected to the dummy reset node and the other electrode connected to the repair wiring.

13. The display apparatus of claim 12, wherein an anode electrode of a light-emitting element of the defective pixel is disconnected from a pixel driving circuit of the defective pixel and connected to the repair wiring, and a dummy anode node of a dummy pixel is connected to the repair wiring.

14. The display apparatus of claim 13, wherein the seventh dummy transistor operates in response to a scan signal activated during a period for resetting an anode electrode of a light-emitting element.

15. The display apparatus of claim 14, wherein the eighth dummy transistor operates in response to an emission control signal activated during a period for causing a light-emitting element to emit light.

16. The display apparatus of claim 12, wherein the reset capacitor has a capacitance value of 10% or more of a parasitic capacitor of the repair wiring.

17. A display apparatus comprising:

a display panel comprising a plurality of pixels, a plurality of dummy pixels, and a repair wiring, wherein the plurality of dummy pixels comprises:

a dummy driving transistor configured to drive a light-emitting element of a defective pixel among the plurality of pixels;

a dummy storage capacitor with one electrode connected to a high-potential driving voltage and the other electrode connected to a gate electrode of the dummy driving transistor;

a first dummy transistor with one electrode connected to the gate electrode of the dummy driving transistor and the other electrode connected to a drain electrode of the dummy driving transistor;

a second dummy transistor with one electrode connected to a source electrode of the dummy driving transistor and the other electrode connected to a data voltage;

a third dummy transistor with one electrode connected to the source electrode of the dummy driving transistor and the other electrode connected to a bias voltage;

a fourth dummy transistor with one electrode connected to the other electrode of the dummy storage capacitor and the other electrode connected to an initialization voltage;

a fifth dummy transistor with one electrode connected to the high-potential driving voltage and the other electrode connected to the source electrode of the dummy driving transistor;

a sixth dummy transistor with one electrode connected to the drain electrode of the dummy driving transistor and the other electrode connected to a dummy anode node; and a seventh dummy transistor with one electrode connected to a reset voltage and the other electrode connected to the repair wiring.

18. The display apparatus of claim 17, wherein an anode electrode of a light-emitting element of the defective pixel is disconnected from a pixel driving circuit of the defective pixel and connected to the repair wiring, a dummy anode node of a dummy pixel is connected to the repair wiring, and the seventh dummy transistor operates in response to a scan signal activated for a period shorter than a period for resetting an anode electrode of a light-emitting element.

* * * * *